(12) United States Patent
Kitahara (10) Patent No.: US 7,999,327 B2
(45) Date of Patent: Aug. 16, 2011

(54) SEMICONDUCTOR DEVICE, AND SEMICONDUCTOR MANUFACTURING METHOD

(75) Inventor: Akinao Kitahara, Gifu (JP)

(73) Assignee: Sanyo Electric Co., Ltd. (JP)

( * ) Notice: Subject to any disclaimer, the term of this patent is extended or adjusted under 35 U.S.C. 154(b) by 156 days.

(21) Appl. No.: 11/290,852

(22) Filed: Nov. 30, 2005

(65) Prior Publication Data

US 2006/0118882 A1 Jun. 8, 2006

(30) Foreign Application Priority Data

Dec. 2, 2004 (JP) ................................. 2004-350218

(51) Int. Cl.
*H01L 27/092* (2006.01)
(52) U.S. Cl. . 257/371; 257/357; 257/369; 257/E27.046; 257/E27.067; 438/228
(58) Field of Classification Search .................. 257/371, 257/E27.067, 369, 372, 357, E27.046; 438/228
See application file for complete search history.

(56) References Cited

U.S. PATENT DOCUMENTS

| 4,819,045 | A | * | 4/1989 | Murakami | 257/408 |
|---|---|---|---|---|---|
| 5,198,880 | A | * | 3/1993 | Taguchi et al. | 257/214 |
| 5,786,617 | A | * | 7/1998 | Merrill et al. | 257/371 |
| 5,892,263 | A | * | 4/1999 | Tachiyama | 257/370 |
| 5,936,282 | A | * | 8/1999 | Baba et al. | 257/355 |
| 6,010,926 | A | | 1/2000 | Rho et al. | |
| 6,472,716 | B2 | | 10/2002 | Igaue et al. | |
| 6,500,705 | B2 | * | 12/2002 | Kumagai | 438/223 |
| 6,806,133 | B2 | | 10/2004 | Oh | |

FOREIGN PATENT DOCUMENTS

| JP | 61-147564 A | 7/1986 |
|---|---|---|
| JP | 6-232355 A | 8/1994 |
| JP | 10-199825 A | 7/1998 |
| JP | 2002-280460 A | 9/2002 |
| JP | 2003-31668 A | 1/2003 |
| JP | 2003-332461 A | 11/2003 |
| JP | 2005-72566 A | 3/2005 |

OTHER PUBLICATIONS

Notice of Grounds for Rejection for Patent Application No. JP2004-350218 with English translation mailed Feb. 2, 2010.

* cited by examiner

*Primary Examiner* — Matthew E Warren
*Assistant Examiner* — John Lin
(74) *Attorney, Agent, or Firm* — Cantor Colburn LLP (57) ABSTRACT

In a semiconductor substrate having a first well of a conductivity type opposite to that of the semiconductor substrate, formed on part of a main surface of the semiconductor substrate, a second well of the same conductivity type as the semiconductor substrate, formed on part of a surface region of the first well shallower than the first well, and a third well of a conductivity type opposite to that of the semiconductor substrate, formed in a surface region of the first well, in a region where the second well is not formed and shallower than the first well, by having a fourth well, formed in a region of the main surface of the semiconductor substrate where the first well is not formed and doped with impurities of the same conductivity type as the semiconductor substrate at a lower concentration than the third well, and controlling a reference voltage to be low, it is possible suppress the occurrence of a latch up phenomenon.

3 Claims, 6 Drawing Sheets

Related Art

SEMICONDUCTOR DEVICE, AND SEMICONDUCTOR MANUFACTURING METHOD

CROSS-REFERENCE TO RELATED APPLICATIONS

The entire disclosures of Japanese Patent Application No. 2004-350218, including specification, claims, drawings, and abstract, are incorporated herein by reference.

BACKGROUND OF THE INVENTION

1. Field of the Invention

The present invention relates to a semiconductor device having a triple well structure that suppresses the occurrence of a latch-up phenomenon, and to a manufacturing method for such a semiconductor device.

2. Description of the Related Art

Figure 4:
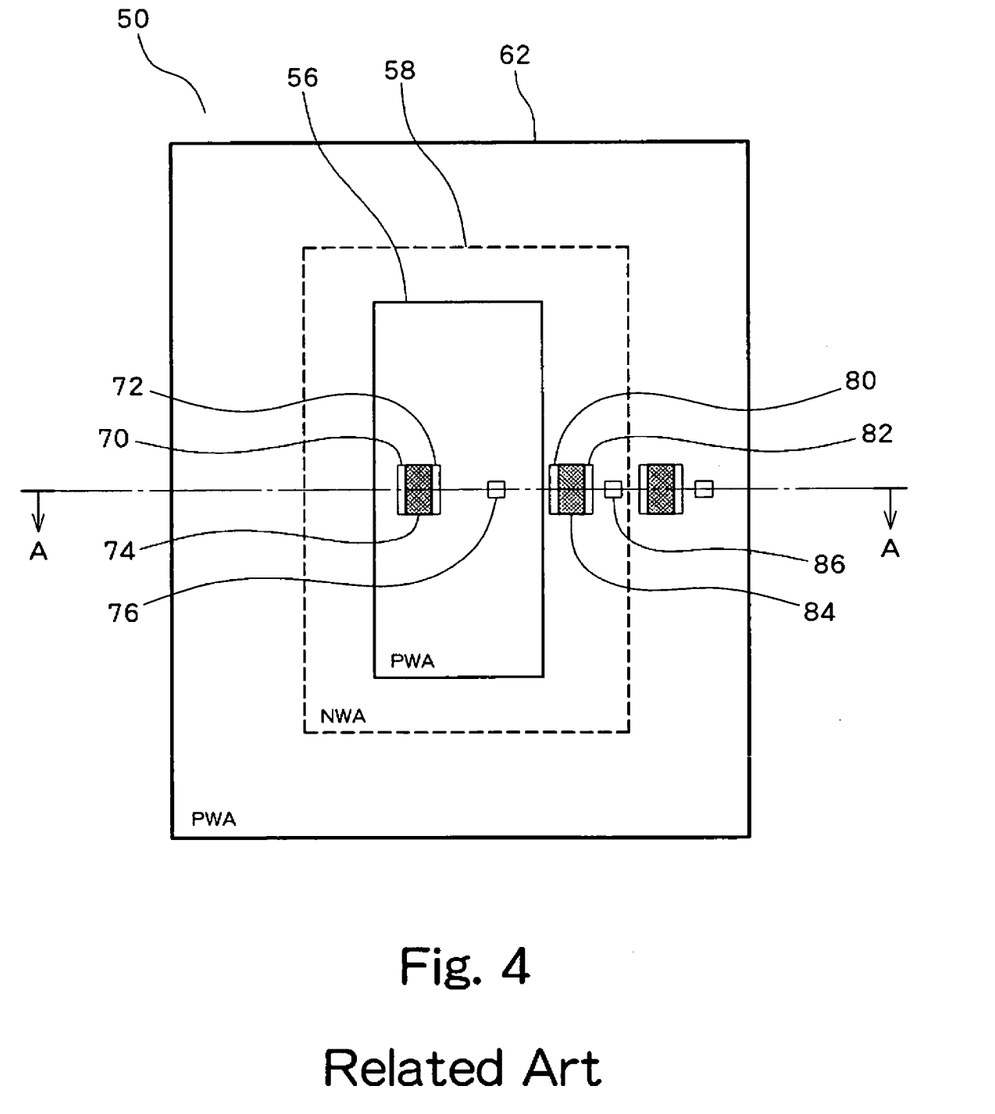
FIG. 4 is a plan view of a semiconductor device of the background art.
Figure 5:
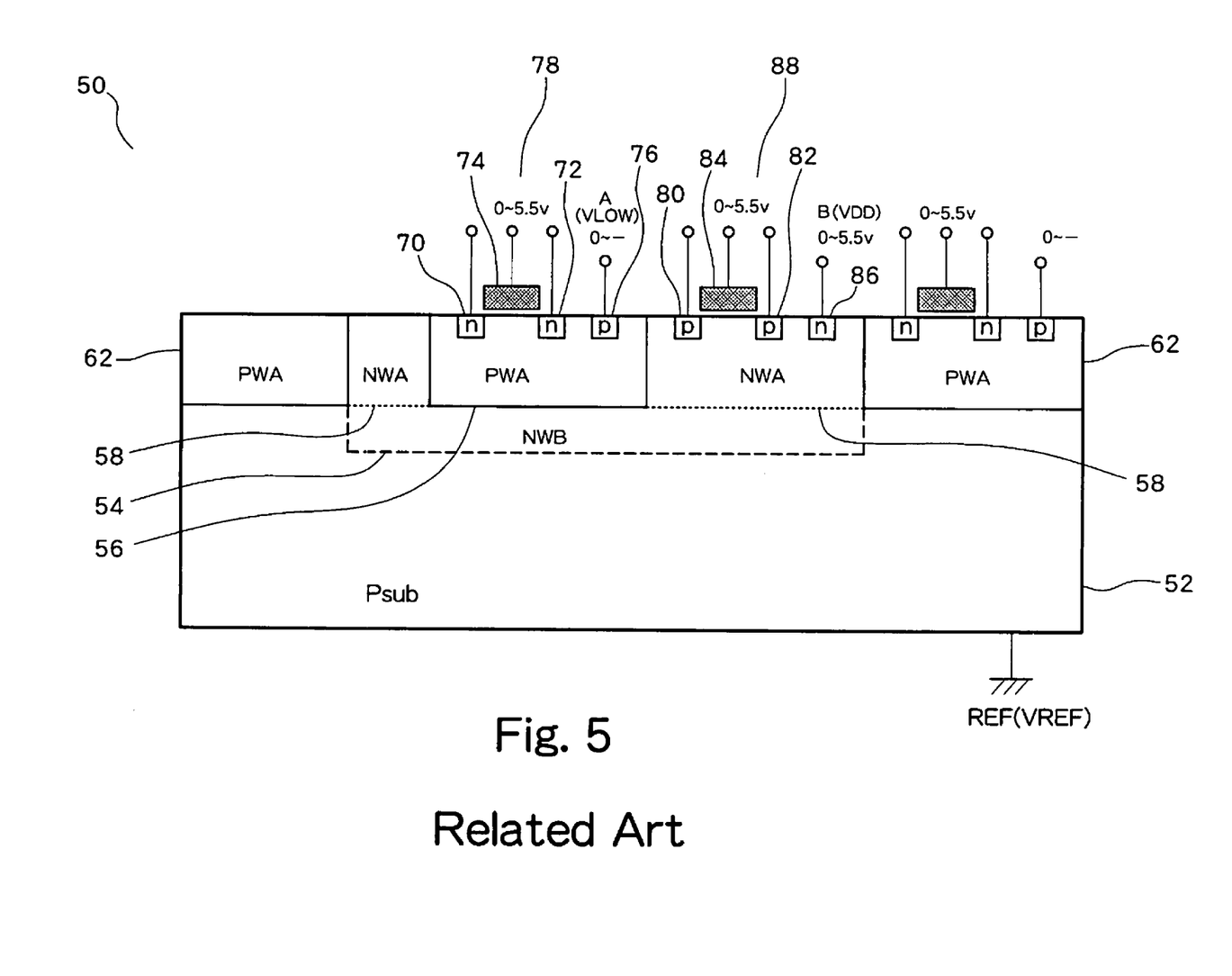
FIG. 5 is a cross sectional view of the semiconductor device of FIG. 4.

A plan view of a semiconductor device 50 constructed with triple well s of the related art is shown in FIG. 4. FIG. 5 shows a cross section of the semiconductor device 50 of FIG. 4 along line A-A.

The semiconductor device 50 is formed on a P-type semiconductor substrate 52. A first N-well 54 doped with N-type impurities is formed in part of a surface region of a main surface of this semiconductor substrate 52. A second P-well 56, doped with P-type impurities, that is shallower than the first N-well 54 is then formed in a surface region of the first N-well 54. A third N-well 58, doped with N-type impurities, that is shallower than the first N-well 54, is then formed in a surface region of the first N-well 54, along the outside of the second P-well 56, where the second P-well 56 is not formed. The impurity concentration of this third N-well 58 is higher than that of the first N-well 54. A fourth P-well 62, doped with P-type impurities, is then formed in a surface region, being the main surface of the semiconductor substrate 52, along the outside of the third N-well 58 where the first N-well 54 is not formed. The impurity concentration of this fourth P-well 62 is higher than that of the semiconductor substrate 52, and has substantially the same impurity concentration as the second P-well 56 and the third N-well 58. In this way, a semiconductor device 50 having a triple well structure is formed. Within this specification, impurity concentration is a concentration of donor impurities or acceptor impurities contributing to carrier generation. Also, a surface region within this specification represents a surface on the semiconductor substrate, and an extremely shallow region in a depth direction of that surface.

Elements are formed in the surface regions of the second P-well 56 and the third N-well 58. For example, NMOS 78 provided with an N-type source region 70, an N-type drain region 72 and a gate 74 is formed in the surface region of the second P-well 56. Also, PMOS 88 provided with a P-type source region 80, a P-type drain region 82 and a gate 84 is formed in the surface region of the third N-well 58.

A P-type P well electrode section 76 is formed in a surface region of the second P-well 56, and connected to an electrode A. This electrode A is held at potential VLOW. Also, an N-type N well electrode section 86 is formed in a surface region of the third N-well 58, and connected to an electrode B. This electrode B is held at a power supply potential VDD. A substrate electrode REF is also provided on the semiconductor substrate 52, and the substrate voltage VREF is held at ground potential.

When using this semiconductor device, the power supply voltage VDD is held at a higher potential than the potential VLOW by control from outside.

Generally, in a semiconductor device having a triple well structure, it is known that a parasitic thyristor is included. In the case of a semiconductor device with this type of parasitic thyristor, there is a problem that a latch-up phenomenon occurs, and an IC containing the semiconductor device is damaged. This problem will now be described.

Figure 6:
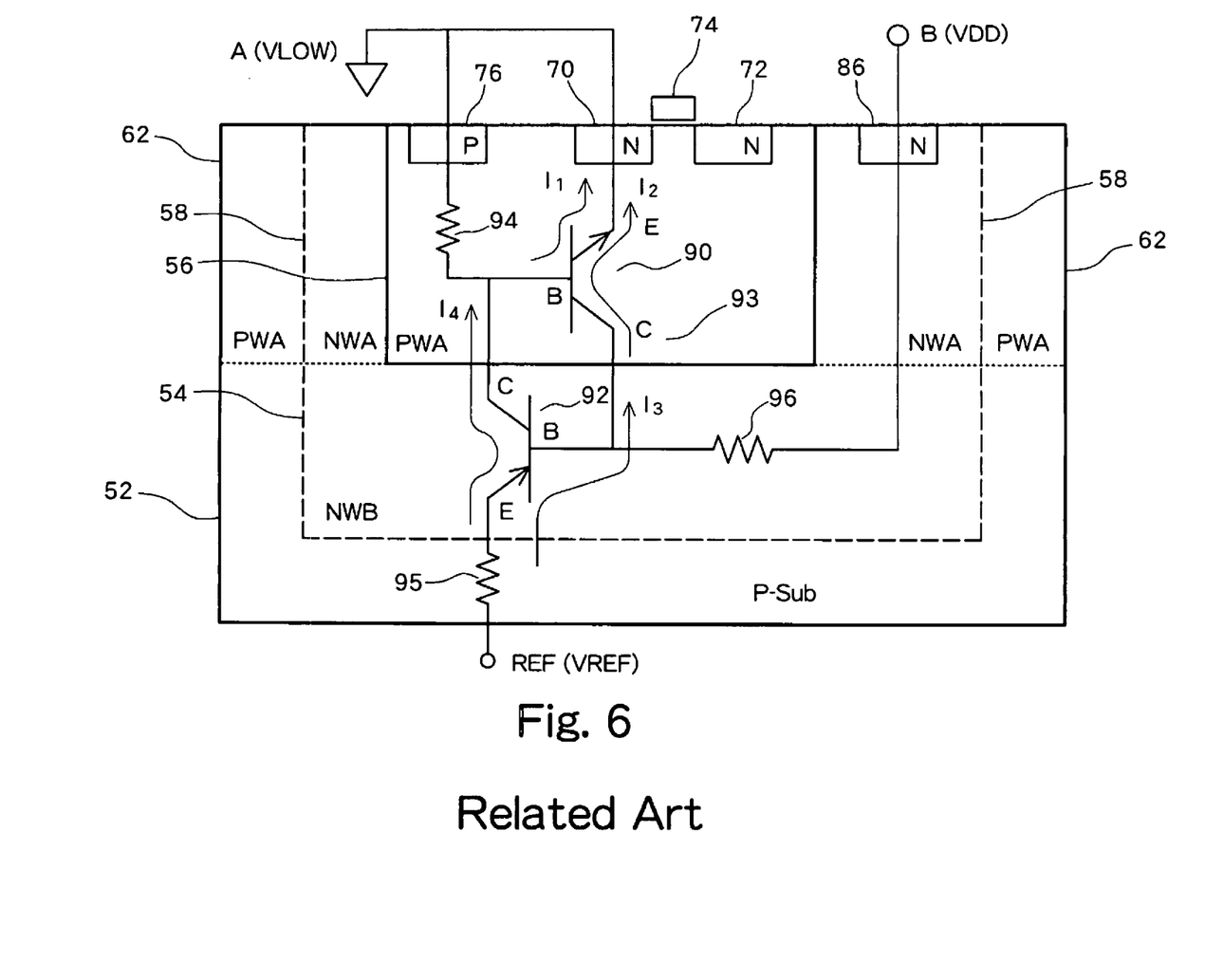
FIG. 6 is an equivalent circuit diagram including parasitic thyristors in the triple well structure of FIG. 5.

FIG. 6 shows an equivalent circuit of a parasitic thyristor formed in the semiconductor device 50. There is a parasitic NPN transistor 90, made up of an emitter that is the source region 70 of the NMOS 78, a collector that is the first N-well 54 and a base that is the second P-well 56, and a parasitic PNP transistor 92, made up of an emitter that is the semiconductor substrate 52, a collector that is the second P-well 56 and a base that is the first N-well 54. Inside the second P-well 56, a parasitic resistor 94 is formed between the base of the parasitic NPN transistor 90 and the P-well electrode section 76. A parasitic resistor 95 is also formed inside semiconductor substrate 52, between the emitter of the parasitic PNP transistor 92 and the substrate electrode REF. A parasitic resistor 96 is also formed inside the first N-well 54, between the base of the parasitic PNP transistor 92 and the third N-well 58.

Next, a latch-up phenomenon where the parasitic thyristor is turned on will be described. If low voltage noise is applied to the P-well electrode section 76 and the source region 70 of the NMOS 78, under the influence of the parasitic resistor 94 the base of the parasitic NPN transistor 90 becomes a higher voltage than the emitter, and noise current I1 flows from the base to the emitter. In this way the parasitic NPN transistor 90 is put into an ON state. If the parasitic NPN transistor 90 is put into an ON state, current I2 flows from the collector of the parasitic NPN transistor 90 to the emitter. If current I2 flows, the base voltage of the parasitic PNP transistor 92 is lowered due to the effect of the parasitic resistor 96. As a result of the base of the parasitic PNP transistor 92 becoming a lower voltage than the emitter due to this voltage lowering, current I3 flows from the emitter to the base of the parasitic PNP transistor 92, and the parasitic PNP transistor 92 is put in an ON state. If the parasitic PNP transistor 92 is put into an ON state, current I4 flows from the emitter of the parasitic PNP transistor 92 to the collector. If current I4 flows, current flows to the base current of the parasitic NPN transistor 90 flows, and the parasitic NPN transistor 90 is held in an ON state. As a result, currents I1-I4 continue to flow even if the initially applied noise disappears. Latch-up occurs in this way. Then, once latch-up occurs a large current flows, and there is a possibility of the IC being damaged by the heat generated by latch-up. There have therefore been various schemes up to now for avoiding the occurrence of latch-up.

In order to reduce the occurrence of the latch-up phenomenon, it has been considered to reduce a potential difference between the base and emitter of the parasitic PNP transistor 92 by making the substrate potential VREF lower than the ground potential, so that current I3 does not flow. In this case, however, a large potential difference arises between the third N-well 58 and the adjacent fourth P-well 62. The third N-well 58 and the fourth P-well 62 form a PN junction, and this PN junction is in a reverse-biased state. As long as the potential difference is small, almost no current flows, but if the reverse bias potential difference exceeds a threshold avalanche occurs, and there is a danger of dielectric breakdown.

SUMMARY OF THE INVENTION

The present invention is a semiconductor device comprising a semiconductor substrate, a first well, of a conductivity type opposite to that of the semiconductor substrate, selectively formed on part of a main surface of the semiconductor substrate, a second well, of the same conductivity type as the semiconductor substrate, selectively formed on part of a surface region of the first well shallower than the first well, and a third well, of a conductivity type opposite to that of the semiconductor substrate, formed in a surface region of the first well, in a region where the second well is not formed and shallower than the first well, and having elements formed in surface regions of the second well and the third well, wherein a fourth well, formed in a surface region of the main surface of the semiconductor substrate contacting the third well without the first well being formed, and doped with impurities of the same conductivity type as the semiconductor substrate at a lower concentration than the third well.

Another embodiment of the present invention is a method of manufacturing a semiconductor device, comprising a first step of selectively doping impurities, of a conductivity type opposite to that of a semiconductor substrate, into part of a main surface of the semiconductor substrate at a higher concentration than the semiconductor substrate, to form a first well, a second step of selectively doping impurities, of the same conductivity type as the semiconductor substrate, into part of a surface region of the first well, shallower than the first well, to form a second well, and a third step of selectively doping impurities, of a conductivity type opposite to that of the semiconductor substrate, into a surface region of the first well at a region where the second well is not formed, shallower than the first well, to form a third well, further comprising a fourth step of doping impurities of the same conductivity type as the semiconductor substrate into a surface region of the main surface of the semiconductor substrate contacting the third well without the first well being formed, at a lower concentration than the third well, to form a fourth well.

BRIEF DESCRIPTION OF THE DRAWINGS

Preferred embodiments of the present invention will be described in detail based on the following drawings, wherein.

DESCRIPTION OF THE PREFERRED EMBODIMENTS

Figure 1:
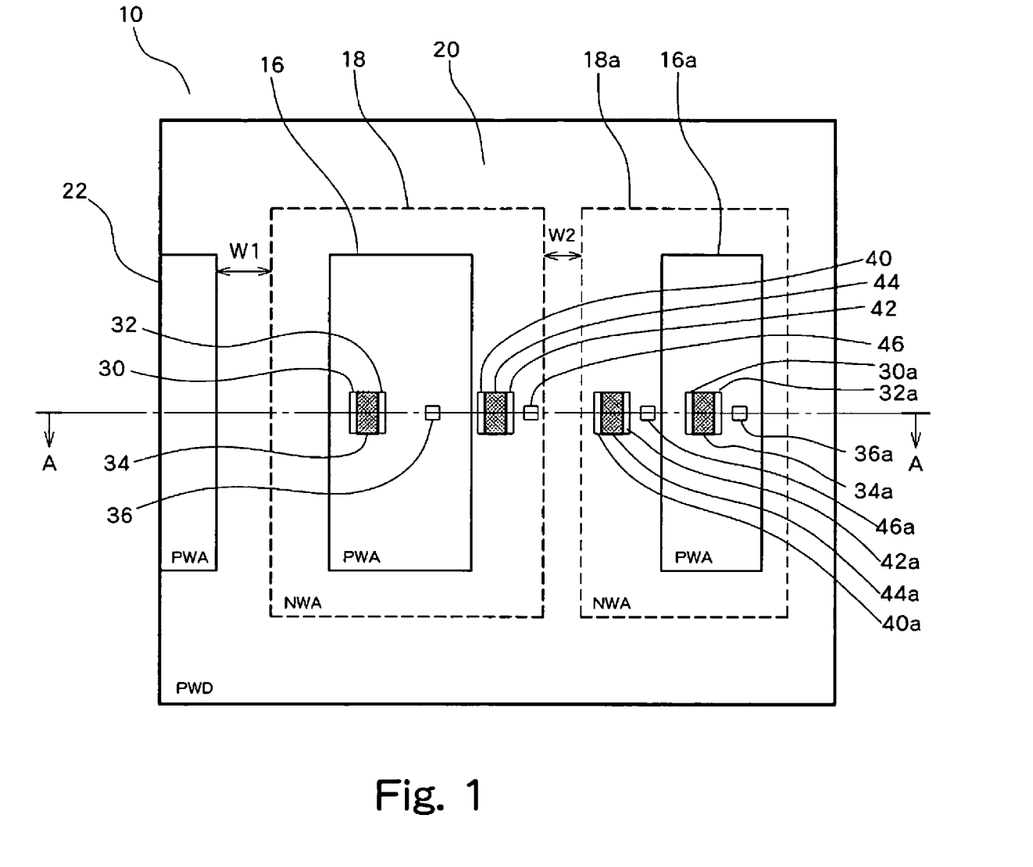
FIG. 1 is a plan view of a semiconductor device of an embodiment of the present invention.
Figure 2:
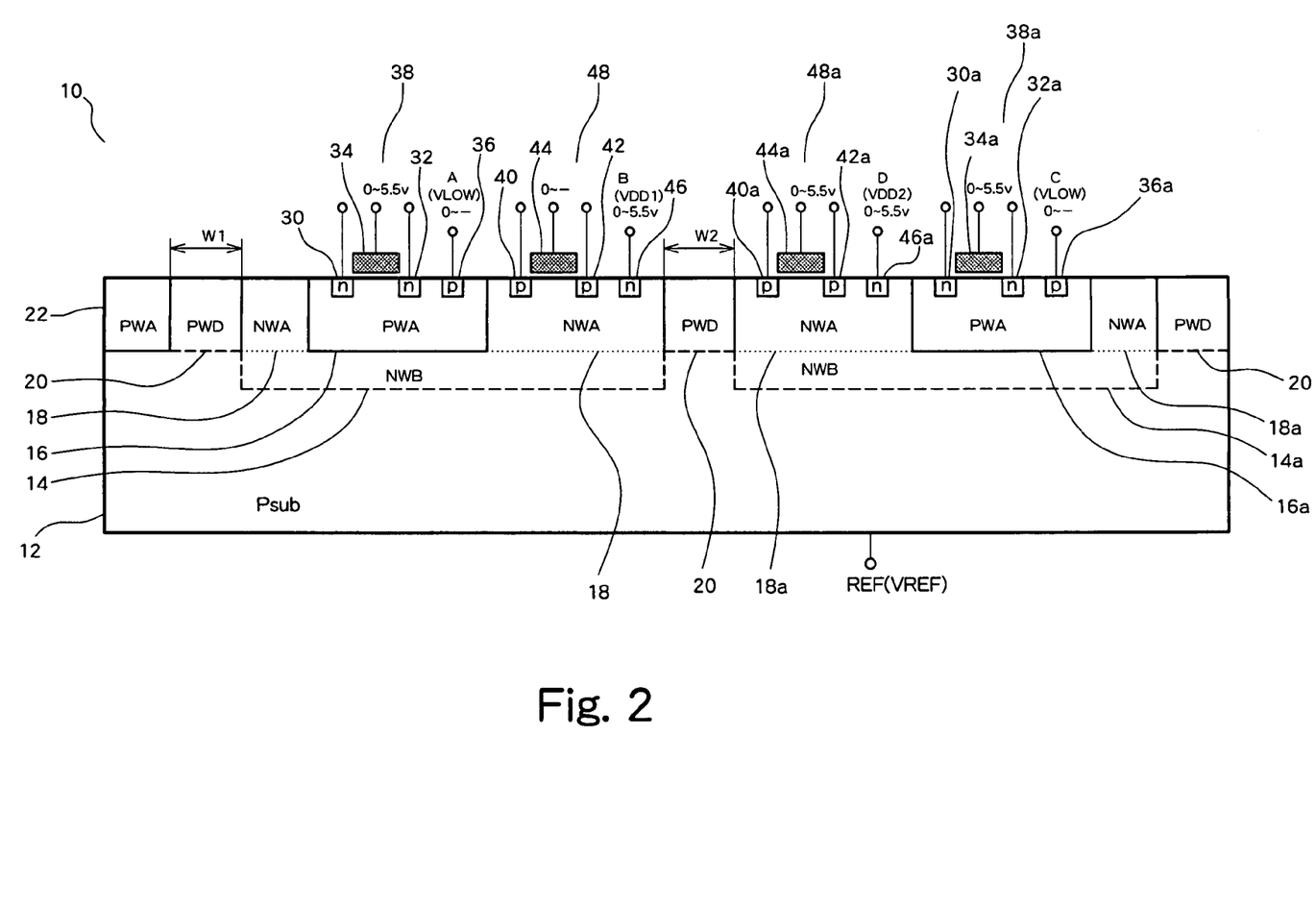
FIG. 2 is a cross sectional view of the semiconductor device of FIG. 1.

FIG. 1 is a plan view of a semiconductor device 10 of an embodiment of the present invention. FIG. 2 shows a cross section of the semiconductor device 10 of FIG. 1 along line A-A. The semiconductor device 10 is formed on a P-type semiconductor substrate 12. A first N-well 14 selectively doped with N-type impurities is formed in part of a surface region of a main surface of the semiconductor substrate 12. A second P-well 16, doped with P-type impurities, that is shallower than the first N-well 14 is then formed in part of a surface region of the first N-well 14. A third N-well 18, doped with N-type impurities, that is shallower than the first N-well 14, is then formed in a surface region of the first N-well 14, at a region where the where the second P-well 16 is not formed, for example, a region excluding the second P-well 16. The impurity concentration of this third N-well 18 is higher than the impurity concentration of the first N-well 14.

It is also possible to form a first N-well 14a, second P-well 16a and third N-well 18a in a region that is separated from the first N-well 14, being a surface region of the main surface of the semiconductor substrate 12. These wells can be respectively formed in the same way as the first N-well 14, second P-well 16 and third N-well 18.

It is also possible to form a fifth P-well 22 doped with P-type impurities in a region that is separated from the first N-well 14 and the first N-well 14a, being a surface region of the main surface of the semiconductor substrate 12. The impurity concentration of this fifth P-type well 22 is about the same as the impurity concentration of the second P-well 16 and the third N-well 18.

With this embodiment, a fourth P-well 20 is formed in surface regions contacting each well, which are regions of the surface region of the main surface of the semiconductor substrate 12 where the first N-well 14, the first n-well 14a, and the fifth P-well 22 are not formed. The impurity concentration of this fourth P-type well 20 is lower than that of the third N-well 18.

Here, it is prefer to form the fourth P-well 20 in all regions between each of the wells. In this case, the first N-well 14a, second N-well 16a and third N-well 18a are formed so as to be opposite the third N-well 18, with the fourth P-well 20 in between. With this embodiment, the width of the fourth P-well 20 is made w2. Also, the fifth P-well 22 is formed so as to be opposite the third N-well 18 with the fourth P-well 20 in between. With this embodiment, the width of the fourth P-well 20 is made w1.

By forming a mask having opening sections at regions where the respective wells are formed, and doping object impurities from the opening sections of this mask to an appropriate depth, it is possible to form the first N-well 14, first N-well 14a, second P-well 16, second P-well 16a, third N-well 18, third N-well 18a, fourth P-well 20, fourth P-well 20a, and fifth P-well 22 on the semiconductor substrate 12. By respectively carrying this out in order from the first N-well 14 to the fifth P-well 22, it is possible to form each well at a specified position.

The impurity concentration of the semiconductor substrate 12 is preferably in a range of $1.0\times10^{15}$-$1.0\times10^{16}$/cm$^3$. The impurity concentration of the first N-well 14, 14a, second P-well 16, 16a, third N-well 18, 18a, fourth P-well 20, and fifth P-well 22 is preferably in a range of $1.0\times10^{16}$-$5.0\times10^{17}$/cm$^3$, with injection carried out so as to maintain the above described relative relationship.

Further, elements are formed in the surface regions of the second P-well 16 and the third N-well 18. For example, NMOS 38 provided with an N-type source region 30, an N-type drain region 32 and a gate 34 is formed in the surface region of the second P-well 16. Also, PMOS 48 provided with a P-type source region 40, a P-type drain region 42 and a gate 44 is formed in the surface region of the third N-well 18. Similarly, elements are also formed in the surface regions of the second P-well 16a and the third N-well 18a. For example, NMOS 38a provided with an N-type source region 30a, an N-type drain region 32a and a gate 34a is formed in the surface region of the second P-well 16a. Also, PMOS 48a provided with a P-type source region 40a, a P-type drain region 42a and a gate 44a is formed in the surface region of the third N-well 18a. Further, elements are formed in the surface region of the fifth P-well 22 and the third N-well 18, in the same manner as the second P-well 16.

A P-type P well electrode section 36 is formed in a surface region of the second P-type well 16, and connected to an electrode A. This electrode A is held at potential VLOW. Also, an N-type N-well electrode section 46 is formed in a surface region of the third N-type well 18, and connected to an electrode B. This electrode B is held at a power supply potential VDD1 that is different to the power supply potential VDD. Similarly, a P-type P well electrode section 36a is formed in a surface region of the second P-type well 16a, and connected to an electrode C. This electrode C is held at potential VLOW. Also, an N-type N-well electrode section 46a is formed in a surface region of the third N-type well 18a and connected to an electrode D. This electrode D is held at a power supply potential VDD2 that is different to the power supply potential VDD. A reference electrode REF is also provided on the semiconductor electrode 12, and held at a reference potential VREF. In this way, a semiconductor device 10 having a triple well structure is formed.

According to this embodiment, a junction withstand voltage between the third N-well 18 and the fourth P-well 20 can be made higher than that in the related art. The reason for this will be described below.

When using the semiconductor device 10, the power supply voltage VDD is held at a higher potential than the potential VLOW. The reference potential VREF is also held at a potential of VLOW or less. With this embodiment, the P-type fourth P-well 20 is adjacent to the N-type third N-well 18, forming a PN junction. Therefore, the potential VLOW is lower than the power supply potential VDD1, and a reverse biased state exists at the PN junction.

Generally, a breakdown voltage of the PN junction is determined by the impurity concentration of the semiconductor region of the low concentration side of the PN junction. The breakdown voltage for avalanche breakdown becomes lower as the impurity concentration of the semiconductor region of the low concentration side increases. Therefore, with this embodiment, as a result of the impurity concentration of the fourth P-well 20 contacting the third N-well 18 is lower than the related art, the junction breakdown voltage between the third N-well 18 and the fourth P-well 20 is made higher than the related art, and it is possible to suppress the occurrence of avalanche breakdown.

On the other hand, if the impurity concentration of the fourth P-well 20 is made too low, electrical isolation between the third N-well 18 and the third N-well 18a adjacent to the fourth P-well 20 is lowered. Accordingly, the impurity concentration of the fourth P-well 20 is appropriately adjusted so that a junction withstand voltage between the third N-well 18 and the fourth P-well 20 is held at a fixed value or greater, and so that there is also a function to electrically isolate between the third N-well 18 and the third N-well 18a. The impurity concentration of this fourth P-well 20 can also be the impurity concentration of the semiconductor substrate 12, but taking in to consideration the relationship with electrical isolation described above, it is preferred to inject impurities so as to give an optimum concentration. The impurity concentration of the semiconductor substrate 12 is generally low, which means that the impurity concentration of the fourth P-well 20 is higher than the semiconductor substrate 12, and lower than the third N-wells 18, 18a. The widths w1 and w2 of the fourth P-well 20 are preferably formed wide enough to obtain the necessary breakdown voltage.

It is also preferable to form the third N-well 18 in a region, being a surface region of the first N-well 14, where the second P-well 16 is not formed, along the entire periphery of the first well. It is possible to increase the withstand voltage by forming the fourth P-well 20 extending fully, so as to contact the outer periphery of the third N-well 18.

In this way, according to this embodiment, a junction withstand voltage between the third N-well 18 and the fourth P-well 20 can be made higher, which means it is also possible to make the reference potential VREF lower than in the related art.

By reducing the reference voltage VREF, it is possible to perform control so that there is no occurrence of the latch up phenomenon even in the event that excessively high voltage noise is generated. It is possible to manufacture a semiconductor device in which the occurrence of the latch up phenomenon is suppressed.

Figure 3:
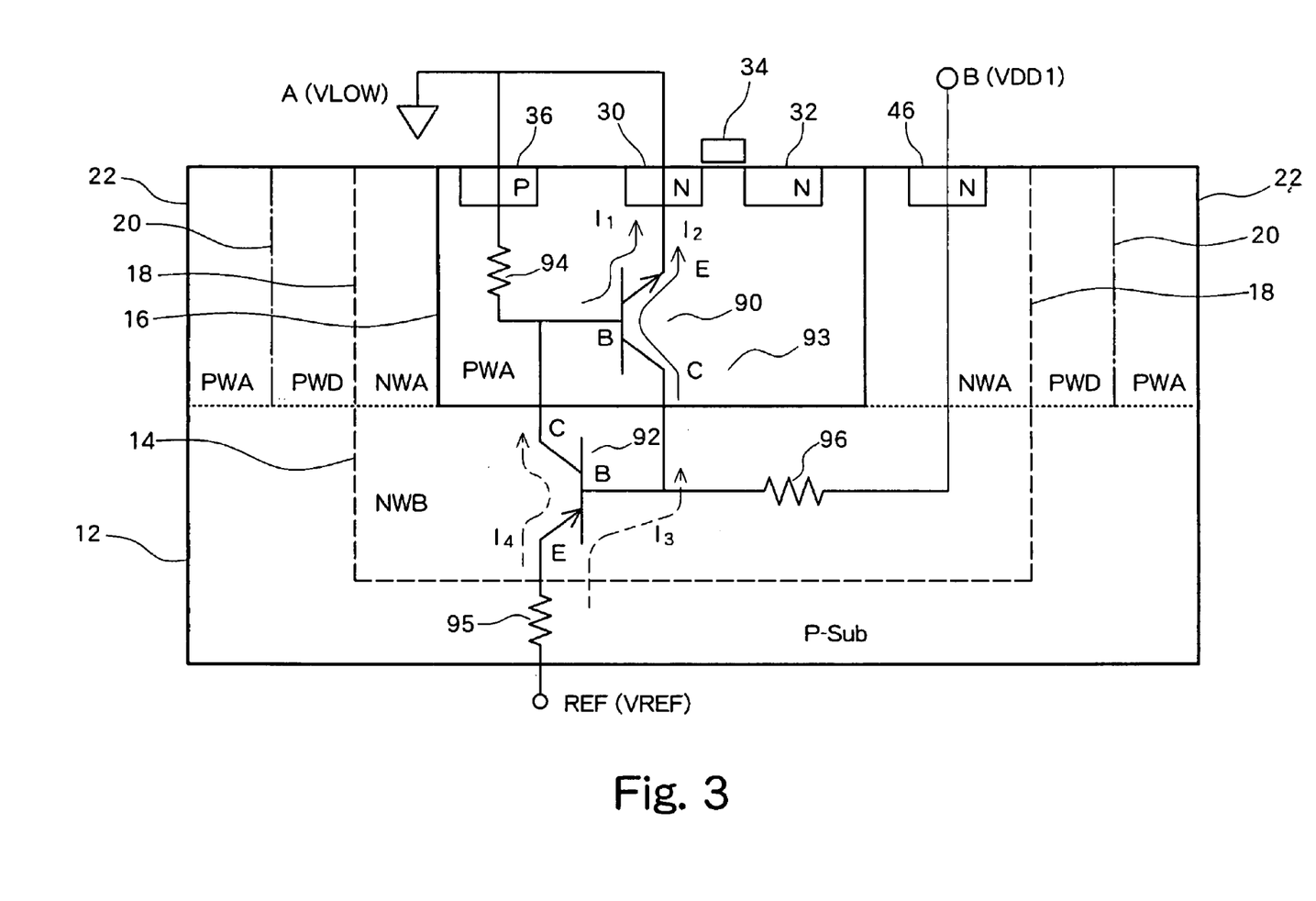
FIG. 3 is an equivalent circuit diagram including parasitic thyristors in the triple well structure of FIG. 2.

The reasons why it is possible to suppress the occurrence of the latch up phenomenon in this embodiment will now be described. The semiconductor device of this embodiment also has a triple well structure, and an equivalent circuit of a parasitic thyristor formed in the semiconductor device 10 also has a parasitic thyristor formed in the same manner as that formed in the semiconductor device 50 of the related art.

FIG. 3 shows an equivalent circuit of a parasitic thyristor formed in the semiconductor device 10. There is a parasitic NPN transistor 90, made up of an emitter that is the source region 30 of the NMOS 38, a collector that is the first N-well 14 and a base that is the second P-well 16, and a parasitic PNP transistor 92, made up of an emitter that is the semiconductor substrate 12, a collector that is the second P-well 16 and a base that is the first N-well 14. The parasitic thyristor 93 is formed by the collector of the parasitic NPN transistor 90 being connected to the base of the parasitic PNP transistor 92, and the collector of the parasitic PNP transistor 92 being connected to the base of the parasitic NPN transistor 90. Inside the second P-well 16, a parasitic resistor 94 is formed between the base of the parasitic NPN transistor 90 and the P-well electrode section 36. A parasitic resistor 95 is also formed inside the semiconductor substrate 12, between the emitter of the parasitic PNP transistor 92 and the substrate electrode REF. A parasitic resistor 96 is also formed inside the first N-well 14, between the base of the parasitic PNP transistor 92 and the third N-well 18.

Similarly to the semiconductor device of the related art, with this embodiment, if low voltage noise is applied to the P-well electrode section 36 and the source region 30 of the NMOS 38, under the influence of the parasitic resistor 94 the base of the parasitic NPN transistor 90 becomes a higher voltage than the emitter, and noise current I1 flows from the base to the emitter. In this way the parasitic NPN transistor 90 is put into an ON state. If the parasitic NPN transistor 90 is put into an ON state, current I2 flows from the collector of the parasitic NPN transistor 90 to the emitter. If current I2 flows, the base voltage of the parasitic PNP transistor 92 is lowered due to the effect of the parasitic resistor 96. In the case of the semiconductor device of the related art, in this situation current I3 would flow from the emitter to the base of the PNP transistor 93. However, with this semiconductor device 10, current I3 does not flow from the emitter to the base of the PNP transistor 92, and current flows from VDD1 through the parasitic resistor 96 to the base of the parasitic transistor 92. This is because it is possible to sufficiently lower the reference potential VREF by providing the fourth P-well 20, and the emitter potential of the parasitic PNP transistor 92 is held at a potential that is the same as or lower than the base potential. Because the current I3 does not flow, the parasitic PNP transistor 92 is kept in an OFF state. As a result current I4 does not flow from the emitter to the base of the parasitic PNP transistor 92. Specifically, current does not flow from the semiconductor substrate 12 to the second P-well 16, thus suppressing the so-called latch up phenomenon. As described above, in the present invention it is possible to sufficiently lower the reference potential VREF by providing the fourth P-well 20, and it is possible to suppress the occurrence of the latch up phenomenon.

Since with this embodiment the impurity concentration of the second P-well 16 and the third N-well 18 where elements are formed is not changed, it is possible to manufacture a semiconductor device that suppresses the occurrence of the latch up phenomenon without affecting element behavior.

The present invention is not limited to the above described embodiment, and various aspects are possible within the scope of the invention. For example, the above described embodiment uses an example where the semiconductor substrate has a P-type conductivity, but the opposite conductivity type is also possible. In this case, the conductivity types of the respective wells and elements are reversed.

What is claimed is:

1. A semiconductor device, comprising:
    a semiconductor substrate of a first conductivity type;
    a first well of a second conductivity type opposite to that of the semiconductor substrate, selectively formed on part of a main surface of the semiconductor substrate;
    a second well of the first conductivity type, selectively formed on part of a surface region of the first well shallower than the first well;
    a third well of the second conductivity type, formed in a surface region of the first well, in a region where the second well is not formed and shallower than the first well, and having elements including a MOSFET formed in surface regions of the second well and the third well;
    a fourth well, formed in a surface region, where the first well is not formed, of the main surface of the semiconductor substrate, contacting the third well, and doped with impurities of the first conductivity type at a higher concentration than an impurity concentration of the semiconductor substrate and at a lower concentration than an impurity concentration of the third well; and
    a fifth well, formed in a surface region, where the first well is not formed, of the main surface of the semiconductor substrate, contacting the fourth well, and doped with impurities of the first conductivity type at a higher concentration than an impurity concentration of the fourth well;
    wherein a reference electrode is provided on the semiconductor substrate and held at a reference potential, and
    the reference potential is lower than a potential applied to the second well.

2. The semiconductor device of claim 1, wherein
    third wells are provided at least two places in the surface region of the main surface of the semiconductor substrate, and
    the fourth well is formed in a region between two different third wells.

3. The semiconductor device of claim 1, wherein
    the third well is formed along an entire inner periphery of the first well.

* * * * *